United States Patent
Scott et al.

(10) Patent No.: US 11,152,895 B2
(45) Date of Patent: Oct. 19, 2021

(54) DOHERTY AMPLIFIER

(71) Applicant: Qorvo US, Inc., Greensboro, NC (US)

(72) Inventors: Baker Scott, San Jose, CA (US);
George Maxim, Saratoga, CA (US);
Dirk Robert Walter Leipold, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 96 days.

(21) Appl. No.: 16/456,697

(22) Filed: Jun. 28, 2019

(65) Prior Publication Data
US 2020/0014337 A1 Jan. 9, 2020

Related U.S. Application Data

(60) Provisional application No. 62/693,669, filed on Jul. 3, 2018.

(51) Int. Cl.
| | | |
|---|---|---|
| *H03F 3/45* | (2006.01) | |
| *H03F 1/02* | (2006.01) | |
| *H01L 29/778* | (2006.01) | |
| *H03F 3/193* | (2006.01) | |

(52) U.S. Cl.
CPC ....... *H03F 1/0288* (2013.01); *H01L 29/7787* (2013.01); *H03F 3/193* (2013.01)

(58) Field of Classification Search
CPC ..... H03F 1/0288; H03F 3/193; H01L 29/7787
USPC ............................................. 330/295, 124 R
See application file for complete search history.

(56) References Cited

U.S. PATENT DOCUMENTS

| | | | |
|---|---|---|---|
| 6,940,349 B2 * | 9/2005 | Hellberg | H03F 1/0288 330/124 R |
| 10,148,228 B2 | 12/2018 | Hayes et al. | |
| 10,355,647 B2 | 7/2019 | Datta et al. | |
| 2018/0006611 A1 * | 1/2018 | de Jong | H03F 1/30 |
| 2018/0026593 A1 | 1/2018 | Ozard et al. | |
| 2019/0379335 A1 | 12/2019 | Scott et al. | |

OTHER PUBLICATIONS

Non-Final Office Action for U.S. Appl. No. 16/436,252, dated Aug. 27, 2020, 6 pages.
Notice of Allowance for U.S. Appl. No. 16/436,252, dated Dec. 9, 2020, 7 pages.

* cited by examiner

*Primary Examiner* — Khanh V Nguyen
*Assistant Examiner* — Khiem D Nguyen
(74) *Attorney, Agent, or Firm* — Withrow & Terranova, PLLC

(57) ABSTRACT

A Doherty amplifier is disclosed with a main amplifier having a main input in communication with a radio frequency (RF) signal input and a main output in communication with a RF signal output. Also included is a peaking amplifier having a peak input in communication with the RF signal input and a peak output in communication with the RF signal input. Further included is main neutralization circuitry having a main neutralization input in communication with the peak input and a main neutralization output in communication with the main input, wherein the main neutralization circuitry is configured to inject a main neutralization signal into the main input such that the main neutralization signal is 180°±10% out of phase and equal in amplitude to within ±10% of a main parasitic feedback signal passed from the main output to the main input by way of a main parasitic feedback capacitance.

19 Claims, 4 Drawing Sheets

DOHERTY AMPLIFIER

RELATED APPLICATIONS

This application claims the benefit of provisional patent application Ser. No. 62/693,669, filed Jul. 3, 2018, the disclosure of which is hereby incorporated herein by reference in its entirety.

This application is related to U.S. patent application Ser. No. 16/436,252, filed Jun. 10, 2019 and issued as U.S. Pat. No. 10,978,999, which claims the benefit of provisional patent application Ser. No. 62/683,309, filed Jun. 11, 2018, the disclosures of which are hereby incorporated herein by reference in their entireties.

FIELD OF THE DISCLOSURE

The present disclosure relates to radio frequency amplifier circuitry and in particular to Doherty radio frequency amplifier circuitry with improved performance.

BACKGROUND

Radio frequency (RF) power amplifiers are used to increase the amplitude of RF signals for transmission. One popular type of RF power amplifier is the Doherty amplifier because of its relatively greater efficiency in comparison with many other RF power amplifier types. The Doherty amplifier includes a main amplifier and a peaking amplifier. Generally, at output power levels below an average output power level, only the main amplifier is active to amplify an RF signal. The peaking amplifier becomes active at an output power level close to around the average power level. As output power increases from activation of the peaking amplifier, the peaking amplifier operates in parallel with the main amplifier to amplify the RF signal. However, once the peaking amplifier becomes active, an undesirable amount of distortion is generated. Accordingly, there is a need for an improved Doherty amplifier that operates with reduced distortion.

SUMMARY

A Doherty amplifier is disclosed with a main amplifier having a main input in communication with a radio frequency (RF) signal input and a main output in communication with a RF signal output. Also included is a peaking amplifier having a peak input in communication with the RF signal input and a peak output in communication with the RF signal output. Further included is main neutralization circuitry having a main neutralization input in communication with the peak input and a main neutralization output in communication with the main input, wherein the main neutralization circuitry is configured to inject a main neutralization signal into the main input such that the main neutralization signal is 180°±10% out of phase and equal in amplitude to within ±10% of a main parasitic feedback signal passed from the main output to the main input by way of a main parasitic feedback capacitance.

In at least some exemplary embodiments, the disclosed Doherty amplifier further includes peak neutralization circuitry having a peak neutralization input in communication with the main input and a peak neutralization output in communication with the peak input, wherein the peak neutralization circuitry is configured to inject a peak neutralization signal into the peak input such that the peak neutralization signal is 180°±10% out of phase and equal to within ±10% in amplitude to a peak parasitic feedback signal passed from the peak output to the peak input by way of a peak parasitic feedback capacitance. Moreover, in at least some exemplary embodiments, the main neutralization circuitry is made up of a main neutralization amplifier coupled between the main neutralization input and the main neutralization output and is configured to generate the main neutralization signal. Further still, in at least some exemplary embodiments, the peak neutralization circuitry is made up of a peak neutralization amplifier coupled between the peak neutralization input and the peak neutralization output and is configured to generate the peak neutralization signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
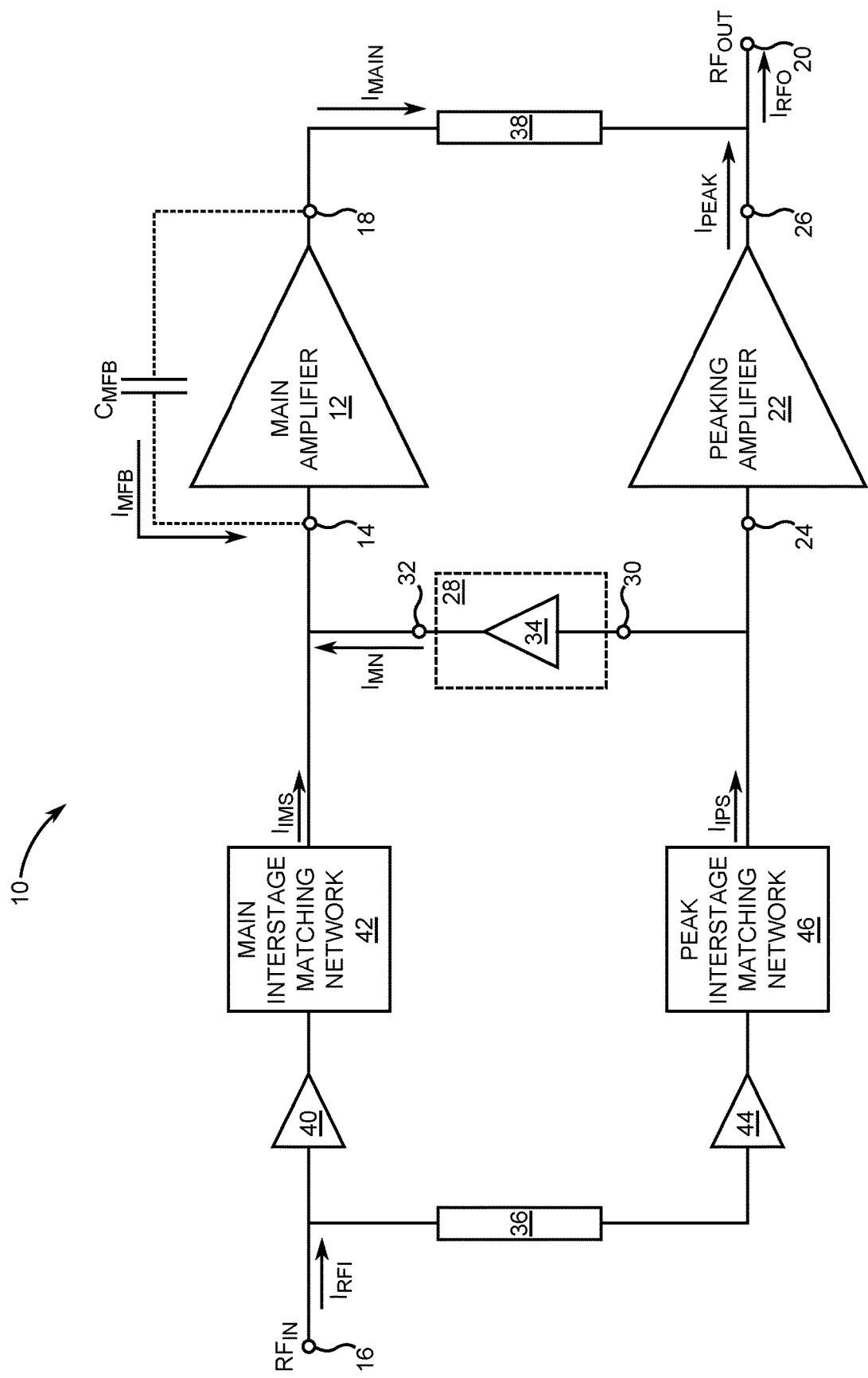
FIG. 1 is a schematic of a first exemplary embodiment of a Doherty amplifier that is in accordance with the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 is a schematic of a first exemplary embodiment of a Doherty amplifier 10 of the present disclosure. The Doherty amplifier 10 has a main amplifier 12 that has a main input 14 in communication with a radio frequency (RF) signal input 16 and a main output 18 in communication with an RF signal output 20. Also included is a peaking amplifier 22 having a peak input 24 in communication with the RF signal input 16 and a peak output 26 in communication with the RF signal output 20.

The Doherty amplifier 10 further includes main neutralization circuitry 28 having a main neutralization input 30 in communication with the peak input 24 and a main neutralization output 32 in communication with the main input 14. In the exemplary embodiment of FIG. 1, the main neutralization circuitry 28 is coupled directly between the main input terminal 14 and the peak input terminal 24.

The main neutralization circuitry 28 is configured to inject a main neutralization signal $I_{MN}$ into the main input 14 such that the main neutralization signal $I_{MN}$ is 180°±10% out of phase and equal in amplitude to within ±10% of an undesired main parasitic feedback signal $I_{MFB}$ passed from the main output 18 to the main input 14 by way of a main parasitic feedback capacitance $C_{MFB}$. In the exemplary embodiment depicted in FIG. 1, the main neutralization circuitry 28 is made up of a main neutralization amplifier 34 that has a gain scaled to maintain the amplitude of the main neutralization signal $I_{MN}$ to within ±10% of the undesired main parasitic feedback signal $I_{MFB}$. A summation of the main neutralization signal $I_{MN}$ and the undesired main parasitic feedback signal $I_{MFB}$ results in the undesired main parasitic feedback $I_{MFB}$ signal being practically eliminated. Therefore, undesirable effects of the main parasitic feedback capacitance $C_{MFB}$ are neutralized by the main neutralization circuitry 28.

The Doherty amplifier 10 further includes an input coupler 36 in communication with the RF signal input 16, the main input 14, and the peak input 24. The input coupler 36 is configured to receive an RF signal $I_{RFI}$ at the RF signal input 16 and provide a first portion $I_{IMS}$ of the RF signal $I_{RFI}$ to the main amplifier 12 through the main input 14. The input coupler 36 provides a second portion $I_{IPS}$ of the RF signal $I_{RFI}$ to the peaking amplifier 22 through the peak input 24. In exemplary embodiments, the input coupler 36 may be a quadrature coupler such as a branchline coupler or a Lange coupler.

The Doherty amplifier 10 further includes an output coupler 38 in communication with the main output 18, the peak output 26, and the RF signal output 20. The output coupler 38 is configured to combine a main output signal $I_{MAIN}$ from the main output 18 with a peak output signal $I_{PEAK}$ from the peak output 26 to produce an RF output signal $I_{RFO}$ at the RF signal output 20. An exemplary version of the output coupler 38 is a quarter-wave transmission line type of impedance inverter. In at least one embodiment, such as depicted in FIG. 1, the output coupler 38 is coupled directly between the main output 18 and the peak output 26.

The Doherty amplifier 10 may also include a main driver amplifier 40 coupled in series with a main interstage matching network 42 between the RF signal input 16 and the main input 14. The Doherty amplifier 10 may further include a peak driver amplifier 44 coupled in series with a peak interstage matching network 46 between the RF signal input 16 and the peak input 24.

Figure 2:
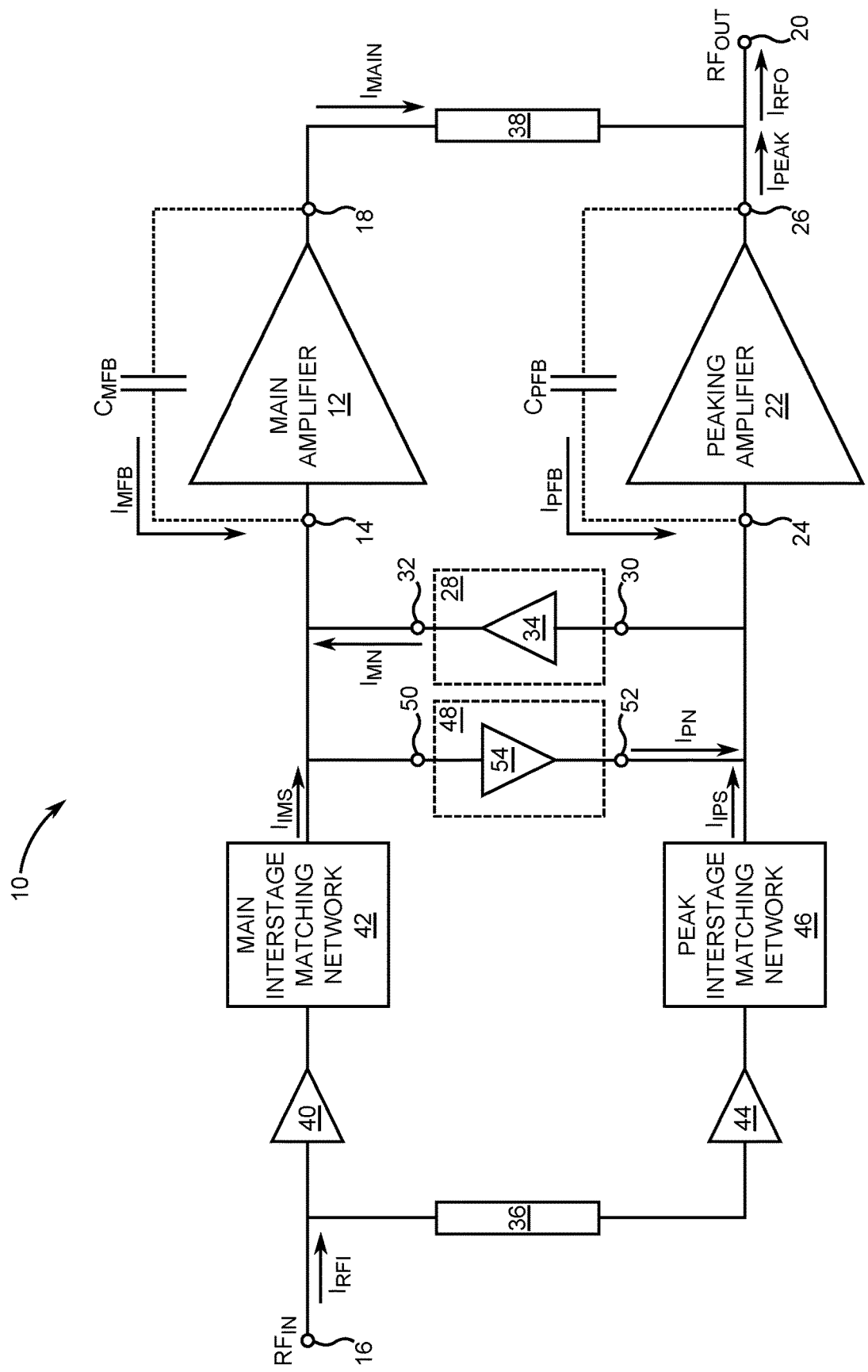
FIG. 2 is a schematic of a second exemplary embodiment of the Doherty amplifier of the present disclosure.

FIG. 2 is a schematic of a second exemplary embodiment of the Doherty amplifier 10. The Doherty amplifier 10 further includes peak neutralization circuitry 48 having a peak neutralization input 50 in communication with the main input 14 and a peak neutralization output 52 in communication with the peak input 24. In the exemplary embodiment of FIG. 2, the peak neutralization circuitry 48 is coupled directly between the main input terminal 14 and the peak input terminal 24.

The peak neutralization circuitry 48 is configured to inject a peak neutralization signal $I_{PN}$ into the peak input 24 such that the peak neutralization signal $I_{PN}$ is 180°±10% out of phase and equal in amplitude to within ±10% of an undesired peak parasitic feedback signal $I_{PFB}$ passed from the peak output 26 to the peak input 24 by way of a peak parasitic feedback capacitance $C_{PFB}$. In the exemplary embodiment depicted in FIG. 2, the peak neutralization circuitry 48 is made up of a peak neutralization amplifier 54 that has a gain scaled to maintain the amplitude of the peak neutralization signal $I_{PN}$ to within ±10% of the undesired peak parasitic feedback signal $I_{PFB}$. A summation of the peak neutralization signal $I_{PN}$ and the undesired peak parasitic feedback signal $I_{PFB}$ results in the undesired peak parasitic feedback $I_{PFB}$ signal being practically eliminated. Therefore, undesirable effects of the peak parasitic feedback capacitance $C_{PFB}$ are neutralized by the peak neutralization circuitry 48.

The main amplifier 12, the peaking amplifier 22, the main driver amplifier 40, the peak driver amplifier 44, the main neutralization amplifier 34, and the peak neutralization amplifier 54 can be fabricated from various amplifier technologies. For example, the various amplifier technologies suitable for realizing the Doherty amplifier 10 include, but are not limited to, complementary metal oxide semiconductor, metal oxide field-effect transistor, junction field-effect transistor, bipolar field-effect transistor, heterojunction bipolar transistor, silicon germanium, gallium arsenide, indium phosphide, and high electron mobility transistor (HEMT), and pseudomorphic HEMT amplifier technologies and combinations thereof.

Figure 3:
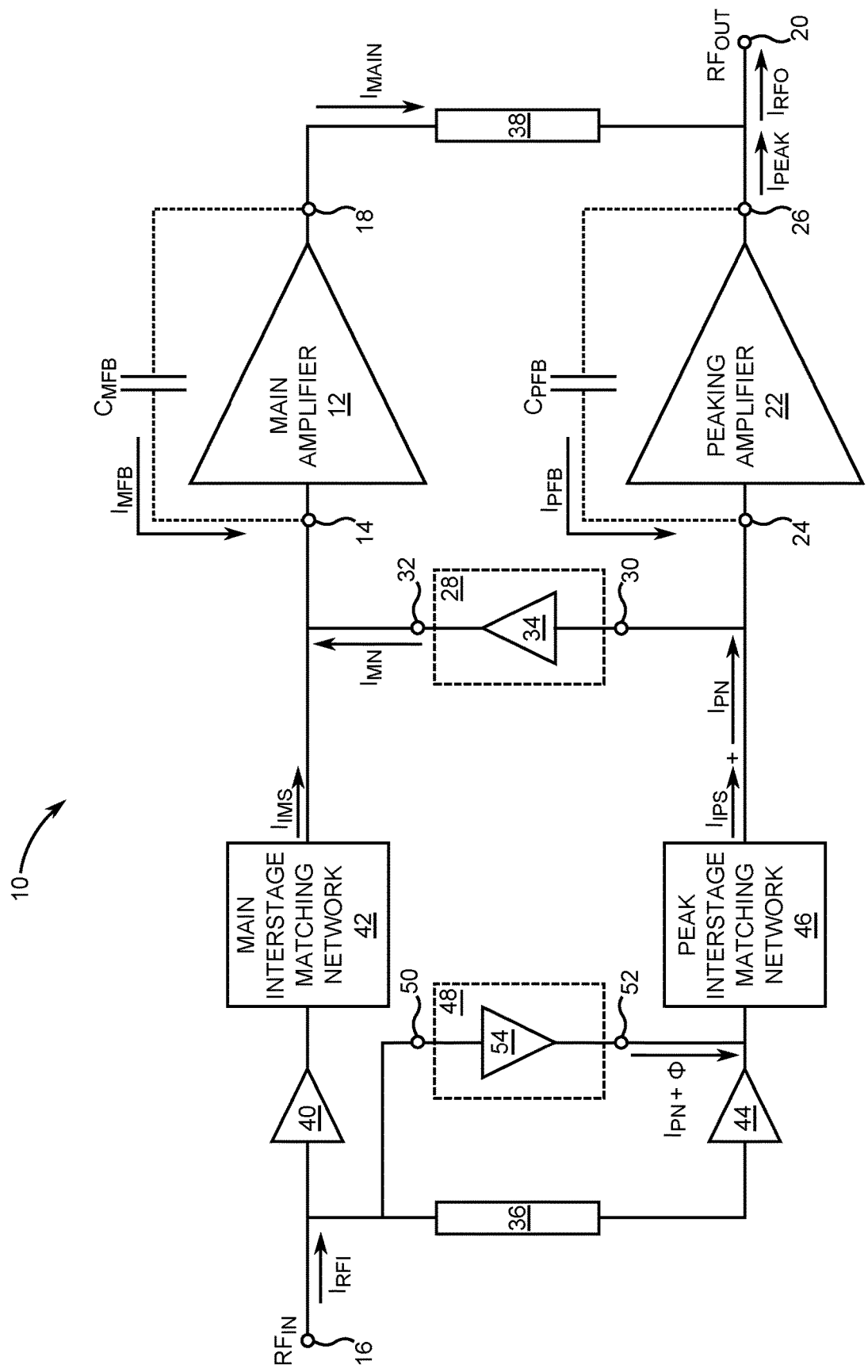
FIG. 3 is a schematic of a third exemplary embodiment of the Doherty amplifier of the present disclosure.

FIG. 3 is a schematic of a third exemplary embodiment of the Doherty amplifier 10. In this third exemplary embodiment, the peak neutralization circuitry 48 has the peak neutralization input 50 coupled to the RF signal input 16 and the peak neutralization output 52 coupled to a node between the peak driver amplifier 44 and the peak interstage matching network 46. In this case, the peak neutralization circuitry 48 outputs the peak neutralization signal $I_{PN}$ with a phase shift such that after passing through the peak interstage matching network 46, the peak neutralization signal $I_{PN}$ is injected into the peak input 24 180°±10% out of phase and equal in amplitude to within ±10% of the undesired peak parasitic feedback signal $I_{PFB}$ passed from the peak output 26 to the peak input 24 by way of the peak parasitic feedback capacitance $C_{PFB}$. In at least one embodiment, the peak neutralization circuitry 48 is configured to pre-adjust the peak neutralization signal with a phase shift to cancel an inherent phase shift of the peak interstage matching network.

In the exemplary embodiment depicted in FIG. 3, the peak neutralization circuitry 48 is made up of a peak neutralization amplifier 54 that has a gain scaled to maintain the amplitude of the peak neutralization signal $I_{PN}$ to within ±10% of the undesired peak parasitic feedback signal $I_{PFB}$. As with the previous embodiments, a summation of the peak neutralization signal $I_{PN}$ and the undesired peak parasitic feedback signal $I_{PFB}$ results in the undesired peak parasitic feedback $I_{PFB}$ signal being practically eliminated. Therefore, undesirable effects of the peak parasitic feedback capacitance $C_{PFB}$ are neutralized by the peak neutralization circuitry 48.

Figure 4:
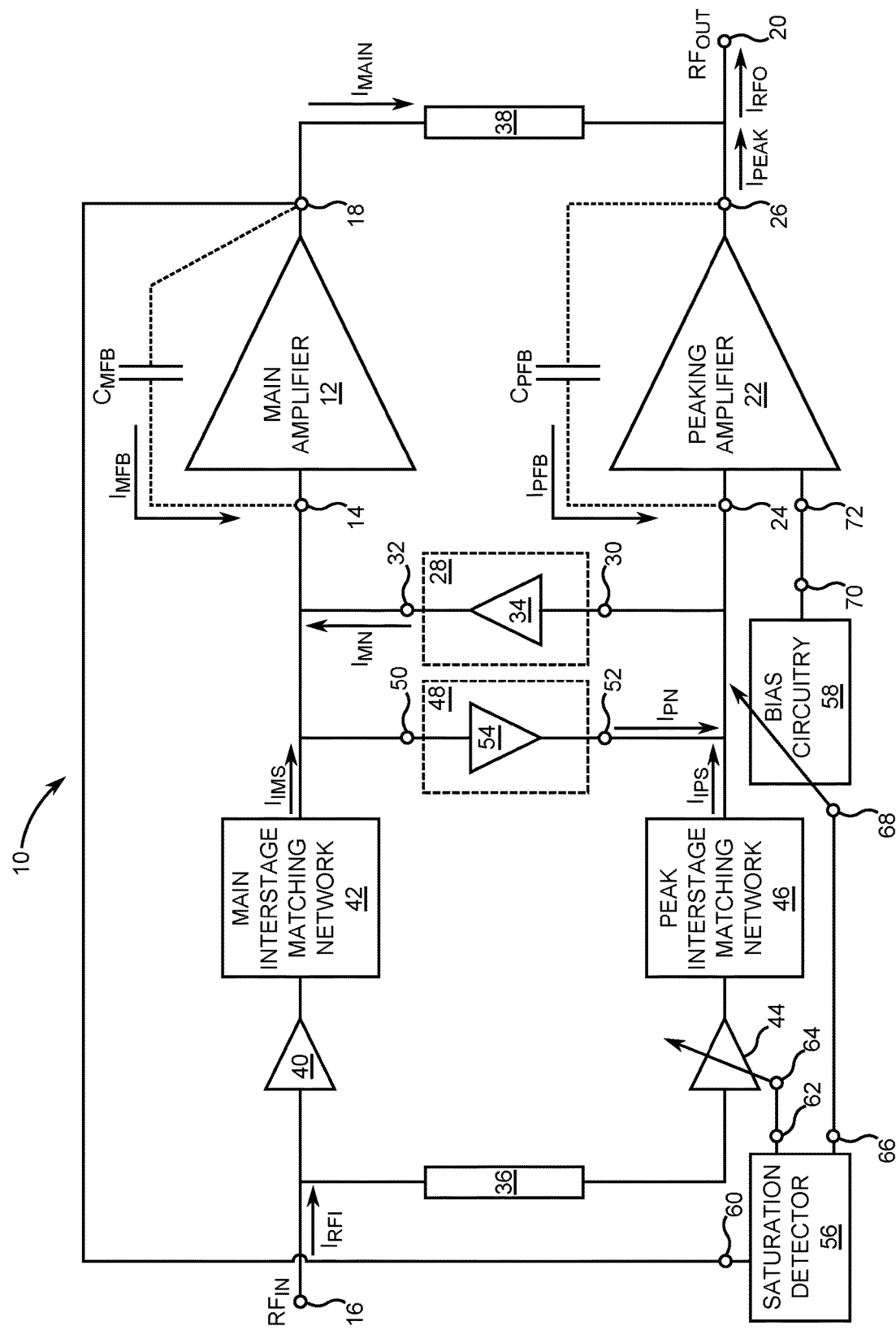
FIG. 4 is a schematic of a fourth exemplary embodiment of the Doherty amplifier of the present disclosure.

FIG. 4 is a schematic of a fourth exemplary embodiment of the Doherty amplifier 10. This embodiment adds a saturation detector 56 and bias circuitry 58 to the second embodiment depicted in FIG. 2. The saturation detector 56 has a detector input 60 that is in communication with the main output 18 of the main amplifier 12 to detect saturation of the main amplifier. The saturation detector 56 also has a first detector output 62 coupled to a gain control input 64 of the peak driver amplifier 44 for controlling the gain of the peak driver amplifier 44. Further still, as depicted in FIG. 4, the saturation detector 56 may include a second detector output 66 that is coupled to a bias control input 68 for adjusting a bias point of the peaking amplifier 22 once the main amplifier 12 reaches saturation. The bias circuitry 58 has a bias output 70 that is coupled to a bias control input 72 of the peaking amplifier 22.

During operation, before the main amplifier 12 reaches saturation at lower power levels, the saturation detector 56 reduces the gain of the peak driver amplifier 44 by way of the first detector output 62 and by way of the second detector output 66 adjusts the bias point of the peaking amplifier 22 for class-C operation. After the main amplifier 12 reaches saturation at higher power levels, the saturation detector 56 increases the gain of the peak driver amplifier by way of the first detector output 62 and by way of the second detector output 66 adjusts the bias point of the peaking amplifier 22 for class-B operation and in some applications class-AB operation. While class-AB operation provides improved linearity, class-AB operation does decrease the efficiency of the peaking amplifier 22 and the overall efficiency of the Doherty amplifier 10.

Those skilled in the art will recognize improvements and modifications to the preferred embodiments of the present disclosure. All such improvements and modifications are considered within the scope of the concepts disclosed herein and the claims that follow.

What is claimed is:

1. A Doherty amplifier comprising:
   a main amplifier having a main input in communication with a radio frequency (RF) signal input and a main output in communication with a RF signal output;
   a peaking amplifier having a peak input in communication with the RF signal input and a peak output in communication with the RF signal output;
   main neutralization circuitry having a main neutralization input in communication with the peak input and a main neutralization output in communication with the main input, wherein the main neutralization circuitry is configured to inject a main neutralization signal into the main input such that the main neutralization signal is 180°±10% out of phase and equal in amplitude to within ±10% of a main parasitic feedback signal passed from the main output to the main input by way of a main parasitic feedback capacitance; and
   peak neutralization circuitry having a peak neutralization input in communication with the main input and a peak neutralization output in communication with the peak input, wherein the peak neutralization circuitry is configured to inject a peak neutralization signal into the peak input such that the peak neutralization signal is 180°±10% out of phase and equal to within ±10% in amplitude to a peak parasitic feedback signal passed from the peak output to the peak input by way of a peak parasitic feedback capacitance.

2. The Doherty amplifier of claim 1 further comprising an input coupler in communication with the RF signal input, the main input, and the peak input, wherein the input coupler is configured to receive an RF signal at the RF signal input and provide a first portion of the RF signal to the main amplifier through the main input and a second portion of the RF signal to the peaking amplifier through the peak input.

3. The Doherty amplifier of claim 1 further comprising an output coupler in communication with the main output, the peak output, and the RF signal output, wherein the output coupler is configured to combine a main output signal from the main output with a peak output signal from the peak output.

4. The Doherty amplifier of claim 3 wherein the output coupler is an impedance inverter.

5. The Doherty amplifier of claim 1 wherein the main neutralization circuitry comprises a main neutralization amplifier coupled between the main neutralization input and the main neutralization output and configured to generate the main neutralization signal.

6. The Doherty amplifier of claim 1 wherein the peak neutralization circuitry comprises a peak neutralization amplifier coupled between the peak neutralization input and the peak neutralization output and configured to generate the peak neutralization signal.

7. The Doherty amplifier of claim 2 further comprising a peak driver amplifier and a peak interstage matching network coupled in series with the input coupler and each other between the RF signal input and the peak input.

8. The Doherty amplifier of claim 7 further comprising the peak neutralization circuitry having the peak neutralization input coupled to the RF signal input and the peak neutralization output coupled to a node shared by the peak driver amplifier and the peak interstage matching network, wherein the peak neutralization circuitry is configured to inject the peak neutralization signal through the peak interstage matching network and into the peak input such that the peak neutralization signal is 180°±10% out of phase and equal to within ±10% in amplitude to the peak parasitic feedback signal passed from the peak output to the peak input by way of the peak parasitic feedback capacitance.

9. The Doherty amplifier of claim 8 wherein the peak neutralization circuitry is configured to pre-adjust the peak neutralization signal with a phase shift to cancel with an inherent phase shift of the peak interstage matching network.

10. The Doherty amplifier of claim 8 further comprising a main driver amplifier and a main interstage matching network coupled in series between the RF signal input and the main input.

11. The Doherty amplifier of claim 7 further comprising a saturation detector having a detector input coupled to the main output of the main amplifier and a first detector output coupled to a gain control input of the peak driver amplifier, wherein the saturation detector is configured to detect saturation of the main amplifier and reduce gain of the peak driver amplifier below saturation operation of the main amplifier and increase gain of the peak driver amplifier above saturation operation of the main amplifier.

12. The Doherty amplifier of claim 11 further comprising bias circuitry having a bias input coupled to a second detector output of the saturation detector and a bias output coupled to the peaking amplifier, wherein the saturation detector is configured to detect saturation of the main amplifier and adjust a bias of the peaking amplifier for class-C below saturation operation of the main amplifier and adjust the bias of the peaking amplifier for class-B operation above saturation operation of the main amplifier.

13. The Doherty amplifier of claim 12 wherein the saturation detector is further configured to further adjust the bias of the peaking amplifier for class-AB operation above saturation operation of the main amplifier.

14. The Doherty amplifier of claim 7 further comprising:
a saturation detector having a detector input coupled to the main output of the main amplifier and a first detector output coupled to a gain control input of the peak driver amplifier, wherein the saturation detector is configured to detect saturation of the main amplifier and reduce gain of the peak driver amplifier below saturation operation of the main amplifier and increase gain of the peak driver amplifier above saturation operation of the main amplifier; and
bias circuitry having a bias input coupled to a second detector output of the saturation detector and a bias output coupled to the peaking amplifier, wherein the saturation detector is configured to detect saturation of the main amplifier and adjust a bias of the peaking amplifier for class-C below saturation operation of the main amplifier and adjust the bias of the peaking amplifier for class-B operation above saturation operation of the main amplifier.

15. The Doherty amplifier of claim 14 wherein the saturation detector is further configured to further adjust the bias of the peaking amplifier for class-AB operation above saturation operation of the main amplifier.

16. The Doherty amplifier of claim 1 further comprising:
a saturation detector having a detector input coupled to the main output of the main amplifier and a detector output; and
bias circuitry having a bias input coupled to the detector output of the saturation detector and a bias output coupled to the peaking amplifier, wherein the saturation detector is configured to detect saturation of the main amplifier and adjust a bias of the peaking amplifier for class-C below saturation operation of the main amplifier and adjust the bias of the peaking amplifier for class-B operation above saturation operation of the main amplifier.

17. The Doherty amplifier of claim 16 wherein the saturation detector is further configured to further adjust the bias of the peaking amplifier for class-AB operation above saturation operation of the main amplifier.

18. The Doherty amplifier of claim 1 wherein the Doherty amplifier is of an amplifier technology group consisting of complementary metal oxide semiconductor, metal oxide field-effect transistor, junction field-effect transistor amplifier technologies, and combinations thereof.

19. The Doherty amplifier of claim 1 wherein the Doherty amplifier is of an amplifier technology group consisting of bipolar field-effect transistor, heterojunction bipolar transistor, silicon germanium, gallium arsenide, indium phosphide, and high electron mobility transistor (HEMT), and pseudomorphic HEMT amplifier technologies and combinations thereof.

* * * * *